United States Patent
Yoshida et al.

(10) Patent No.: US 11,411,194 B2
(45) Date of Patent: Aug. 9, 2022

(54) LIGHT-EMITTING DEVICE

(71) Applicant: PIONEER CORPORATION, Tokyo (JP)

(72) Inventors: Ayako Yoshida, Tokyo (JP); Takashi Chuman, Tokyo (JP); Makoto Matsukawa, Tokyo (JP); Takeru Okada, Tokyo (JP); Chihiro Harada, Tokyo (JP); Akira Hirasawa, Tokyo (JP)

(73) Assignee: PIONEER CORPORATION, Tokyo (JP)

( * ) Notice: Subject to any disclaimer, the term of this patent is extended or adjusted under 35 U.S.C. 154(b) by 315 days.

(21) Appl. No.: 16/614,287

(22) PCT Filed: May 9, 2018

(86) PCT No.: PCT/JP2018/017889
§ 371 (c)(1),
(2) Date: Nov. 15, 2019

(87) PCT Pub. No.: WO2018/212035
PCT Pub. Date: Nov. 22, 2018

(65) Prior Publication Data
US 2020/0152900 A1    May 14, 2020

(30) Foreign Application Priority Data

May 15, 2017    (JP) .............................. JP2017-096332

(51) Int. Cl.
*H01L 51/52*    (2006.01)
*H01L 51/50*    (2006.01)

(52) U.S. Cl.
CPC ........ *H01L 51/5012* (2013.01); *H01L 51/524* (2013.01); *H01L 51/5271* (2013.01)

(58) Field of Classification Search
CPC ........................ H01L 27/3218; H01L 27/3244
See application file for complete search history.

(56) References Cited

U.S. PATENT DOCUMENTS 9,508,961 B2    11/2016    Hirakata et al.
9,997,493 B2 *    6/2018    Guo .................. H01L 23/49816
(Continued)

FOREIGN PATENT DOCUMENTS

JP    H11-102166 A    4/1999
JP    2004317837 A    11/2004
(Continued)

OTHER PUBLICATIONS

International Search Report for related International Application No. PCT/JP2018/017889 dated Aug. 7, 2018; 2 pages.

*Primary Examiner* — Fernando L Toledo
*Assistant Examiner* — Valerie N Newton
(74) *Attorney, Agent, or Firm* — Procopio, Cory, Hargreaves & Savitch LLP

(57) ABSTRACT

A light-emitting device (20) includes a first light-emitting member (10a) and a second light-emitting member (10b). Each of the first light-emitting member (10a) and the second light-emitting member (10b) includes a first surface (12) and a second surface (14), and light is emitted from the first surface (12). The first light-emitting member (10a) includes a first region (16a) and a second region (16b), the first region (16a) of the first light-emitting member (10a) being located on the second surface (14) side of the second light-emitting member (10b) and the second region (16b) of the first light-emitting member (10a) being located on the first surface (12) side of the second light-emitting member (10b).

10 Claims, 12 Drawing Sheets

(56) References Cited

U.S. PATENT DOCUMENTS

| | | |
|---|---|---|
| 10,326,100 B2 | 6/2019 | Hirakata et al. |
| 2014/0045283 A1 | 2/2014 | Hirakata et al. |
| 2014/0145161 A1* | 5/2014 | Naijo .................. H01L 51/0097 |
| | | 257/40 |
| 2017/0069867 A1 | 3/2017 | Hirakata et al. |
| 2019/0296258 A1 | 9/2019 | Hirakata et al. |
| 2020/0258864 A1* | 8/2020 | Wang .................. H01L 27/3246 |

FOREIGN PATENT DOCUMENTS

| | | | |
|---|---|---|---|
| JP | 2009211828 A | 9/2009 | |
| JP | 2013131454 A | 7/2013 | |
| JP | 2013201105 A | 10/2013 | |
| JP | 2014091885 A | 5/2014 | |
| JP | 2015026551 A | 2/2015 | |
| JP | 2017076128 A | 4/2017 | |

* cited by examiner

LIGHT-EMITTING DEVICE

CROSS-REFERENCE TO RELATED APPLICATIONS

This application is a U.S. National Stage entry of PCT Application No: PCT/JP2018/017889 filed May 9, 2018, which claims priority to Japanese Patent Application No. 2017-096332, filed May 15, 2017, the contents of which are incorporated herein by reference.

TECHNICAL FIELD

The present invention relates to a light-emitting device.

BACKGROUND ART

In recent years, there has been the development of three-dimensional light-emitting devices, and particularly, Patent Document 1 describes a light-emitting device having an EL (electro luminescence) sheet. This EL sheet includes a plurality of notches, and each notch extends in a spiral shape. Therefore, when the EL sheet is stretched out in the vertical direction, a portion of the EL sheet between adjacent notches extends in a spiral shape.

Patent Document 2 also describes a three-dimensional light-emitting device, and particularly, the light-emitting device in Patent Document 2 has a shape of a flower. The light-emitting device has a plurality of light diffusion plates and a plurality of light sources, and each of the plurality of light sources is installed on each of the plurality of light diffusion plates. Each of the plurality of light diffusion plates has a shape of a petal, and light emitted from the light source is diffused by the light diffusion plate.

Patent Document 3 also describes a three-dimensional light-emitting device, and particularly, Patent Document 3 uses a pair of mirrors facing each other. The light-emitting device includes a half mirror and a reflection mirror, and light is repeatedly reflected between the half mirror and the reflection mirror. Therefore, a plurality of images reflected in the reflection mirror are reflected aligned toward the back of the reflection mirror, and a sense of depth can be provided.

RELATED ART DOCUMENT

Patent Document

[Patent Document 1]: Japanese Unexamined Patent Application Publication No. 2013-201105
[Patent Document 2]: Japanese Unexamined Patent Application Publication No. 2014-91885
[Patent Document 3]: Japanese Unexamined Patent Application Publication No. 2013-131454

SUMMARY OF THE INVENTION

The inventors considered to manufacture a three-dimensional light-emitting device by a method which is different from that in Patent Documents 1-3. Particularly, the inventors of the present invention considered using an organic light-emitting diode (OLED). Generally, an OLED has a high degree of freedom in terms of shape, and the inventors considered providing a stereoscopic feeling to the light-emitting device by effectively using the high degree of freedom in the shape of an OLED panel.

An example of the problem to be solved by the present invention is to provide a light-emitting device having a stereoscopic feeling.

The invention described in claim 1 is a light-emitting device including:

a first light-emitting member and a second light-emitting member, each of the first light-emitting member and the second light-emitting member including a first surface emitting light, a second surface on the opposite side of the first surface, a first electrode, an organic layer, and a second electrode, in which the first light-emitting member includes: a first region located on the second surface side of the second light-emitting member; and a second region located on the first surface side of the second light-emitting member.

BRIEF DESCRIPTION OF THE DRAWINGS

The objects described above, and other objects, features and advantages are further made apparent by suitable embodiments that will be described below and the following accompanying drawings.

DESCRIPTION OF EMBODIMENT

Figure 1:
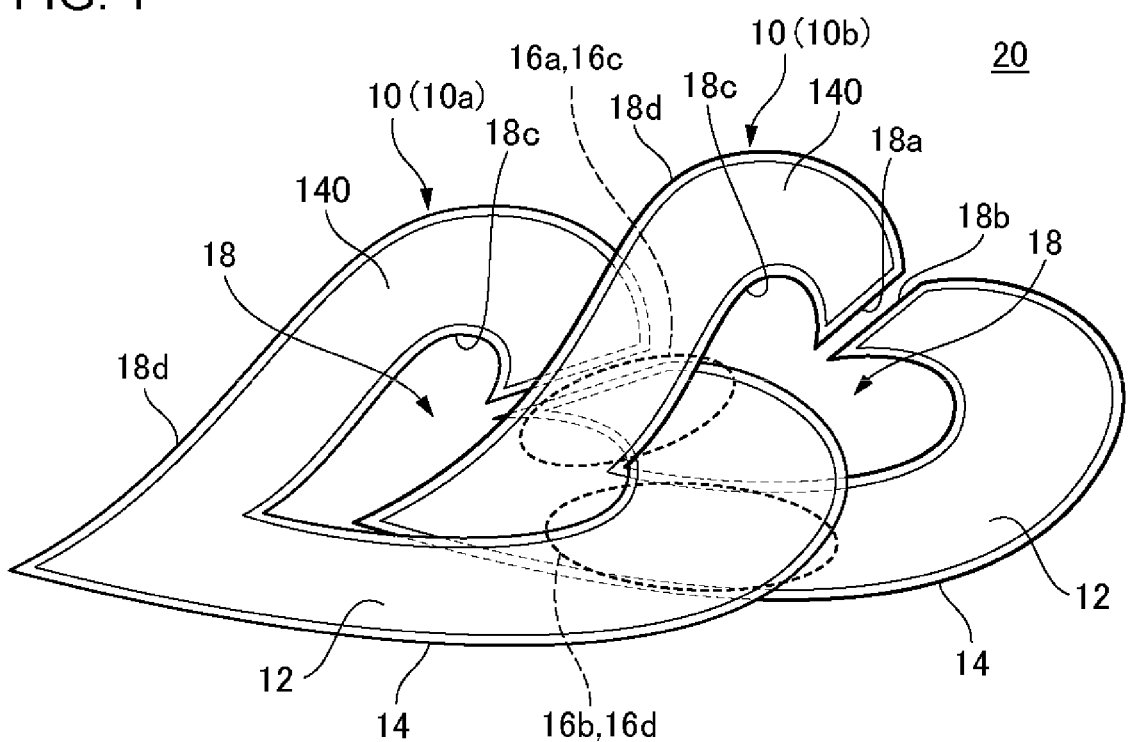
FIG. 1 is a perspective view showing a light-emitting device according to an embodiment.

Embodiments of the present invention will be described below by referring to the drawings. Moreover, in all the drawings, the same constituent elements are given the same reference numerals, and descriptions thereof will not be repeated.

Figure 2:
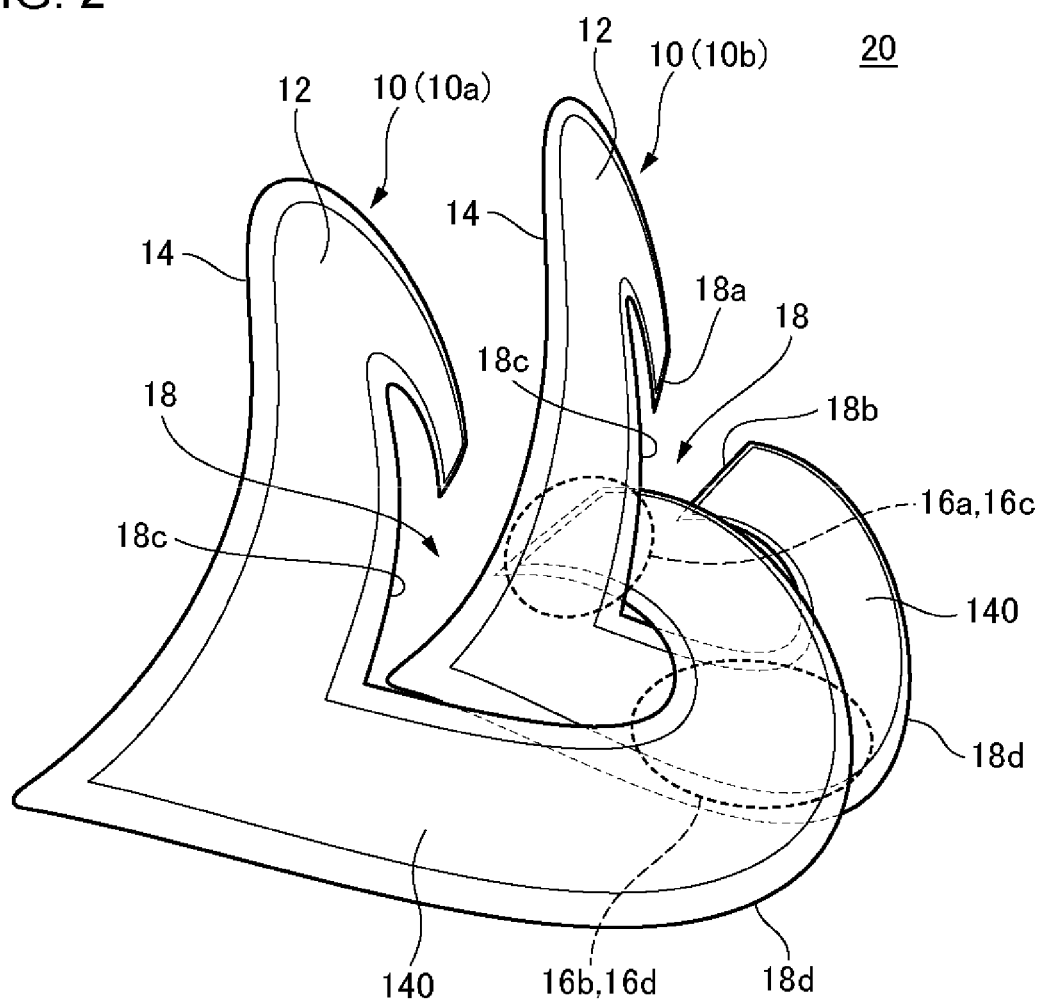
FIG. 2 is a perspective view of the light-emitting device shown in FIG. 1 viewed from a direction different from that of FIG. 1.
Figure 3:
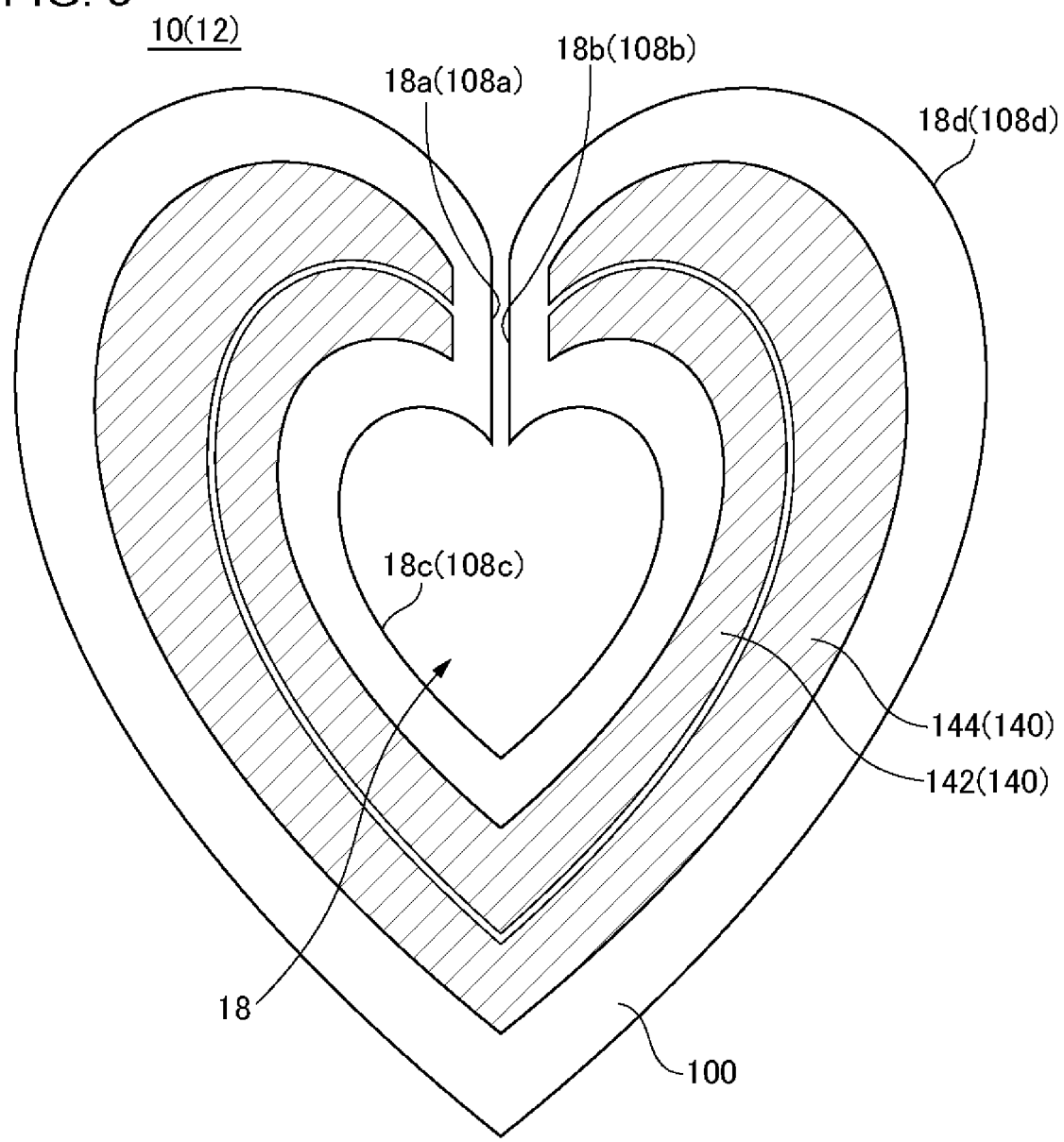
FIG. 3 is a plan view showing a light-emitting member shown in FIG. 1 and FIG. 2 viewed from a first surface side of the light-emitting member.
Figure 4:
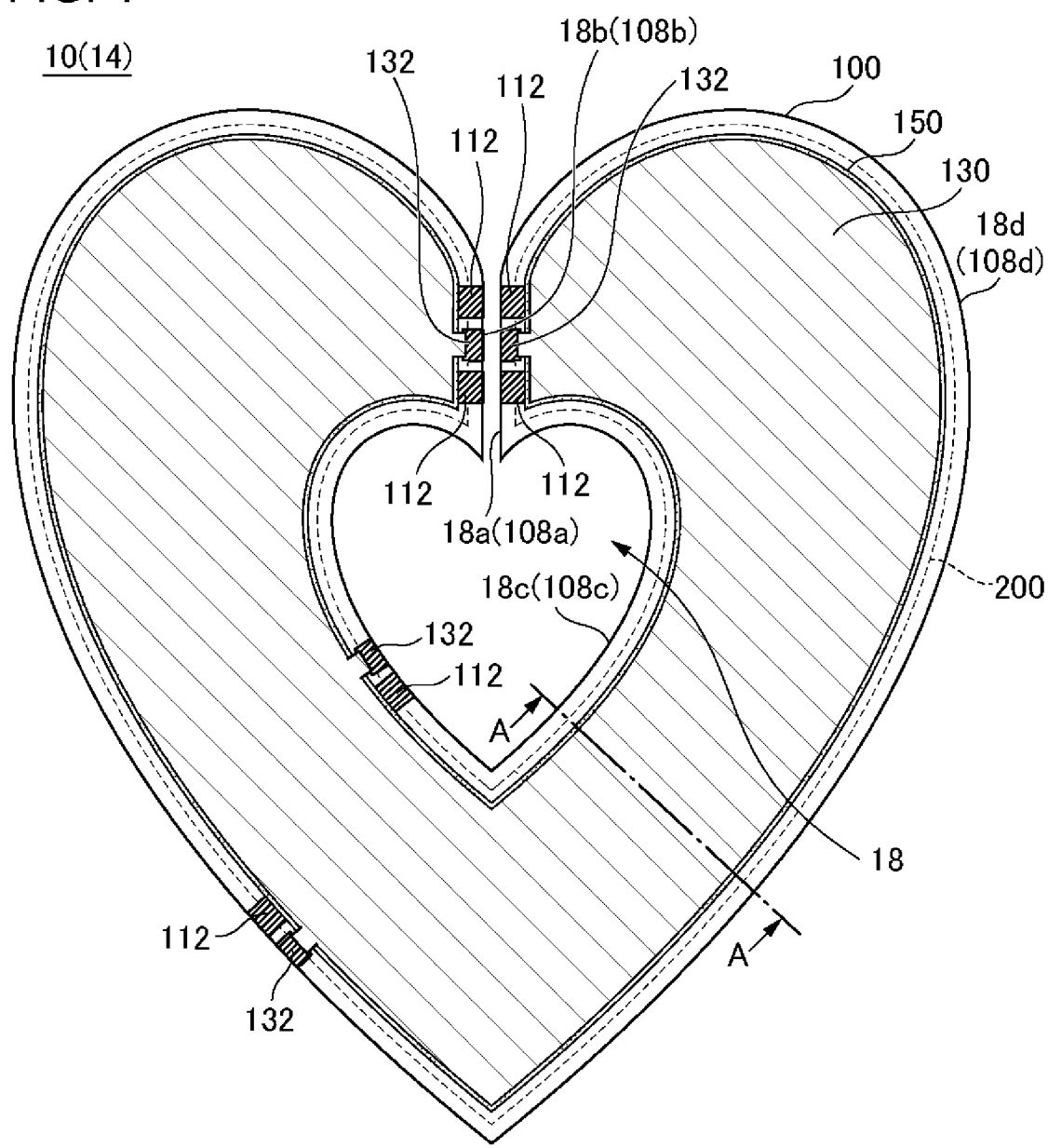
FIG. 4 is a plan view showing a light-emitting member shown in FIG. 1 and FIG. 2 viewed from a second surface side of the light-emitting member.
Figure 5:
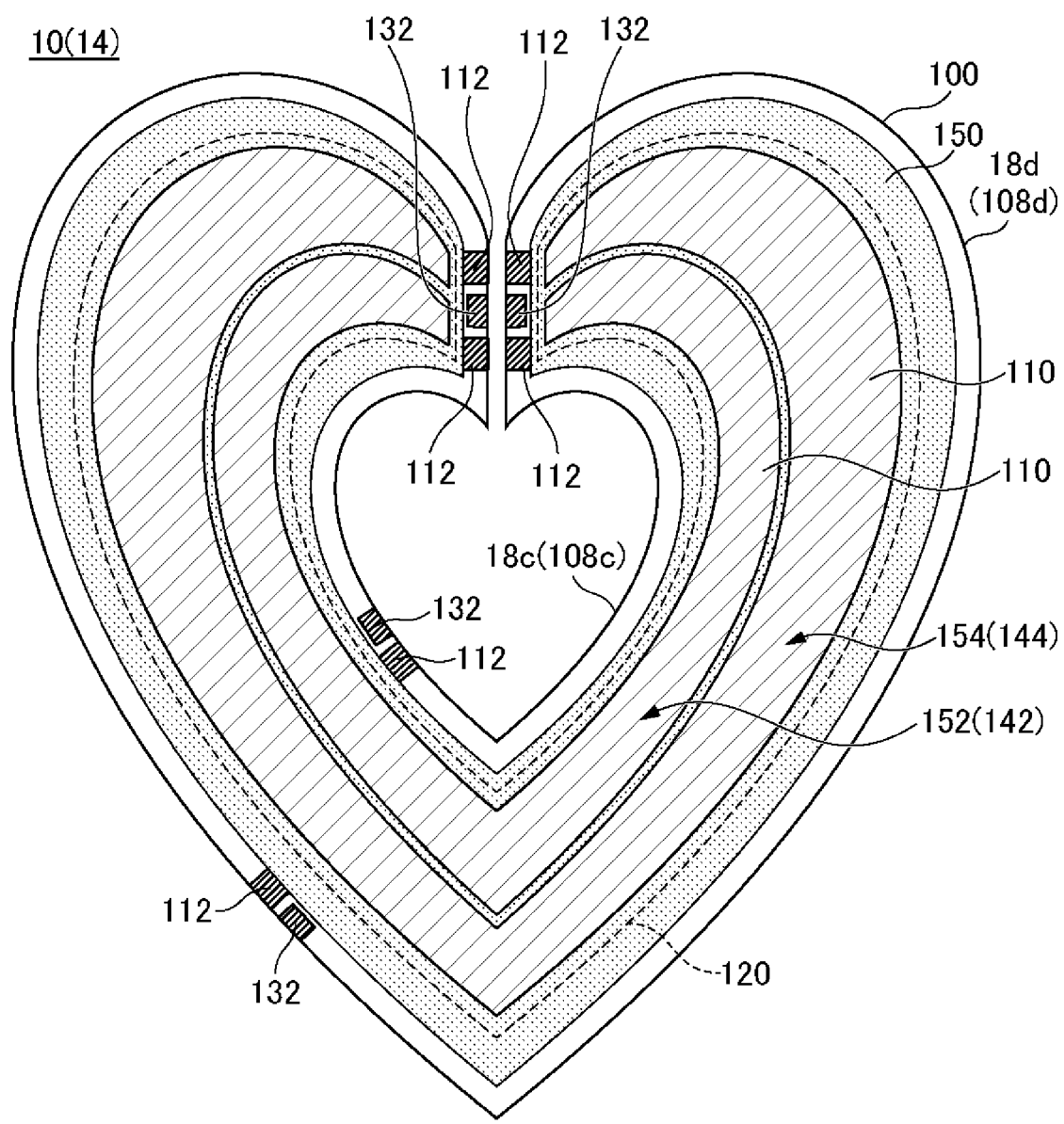
FIG. 5 is a diagram in which a second electrode is removed from FIG. 4.
Figure 6:
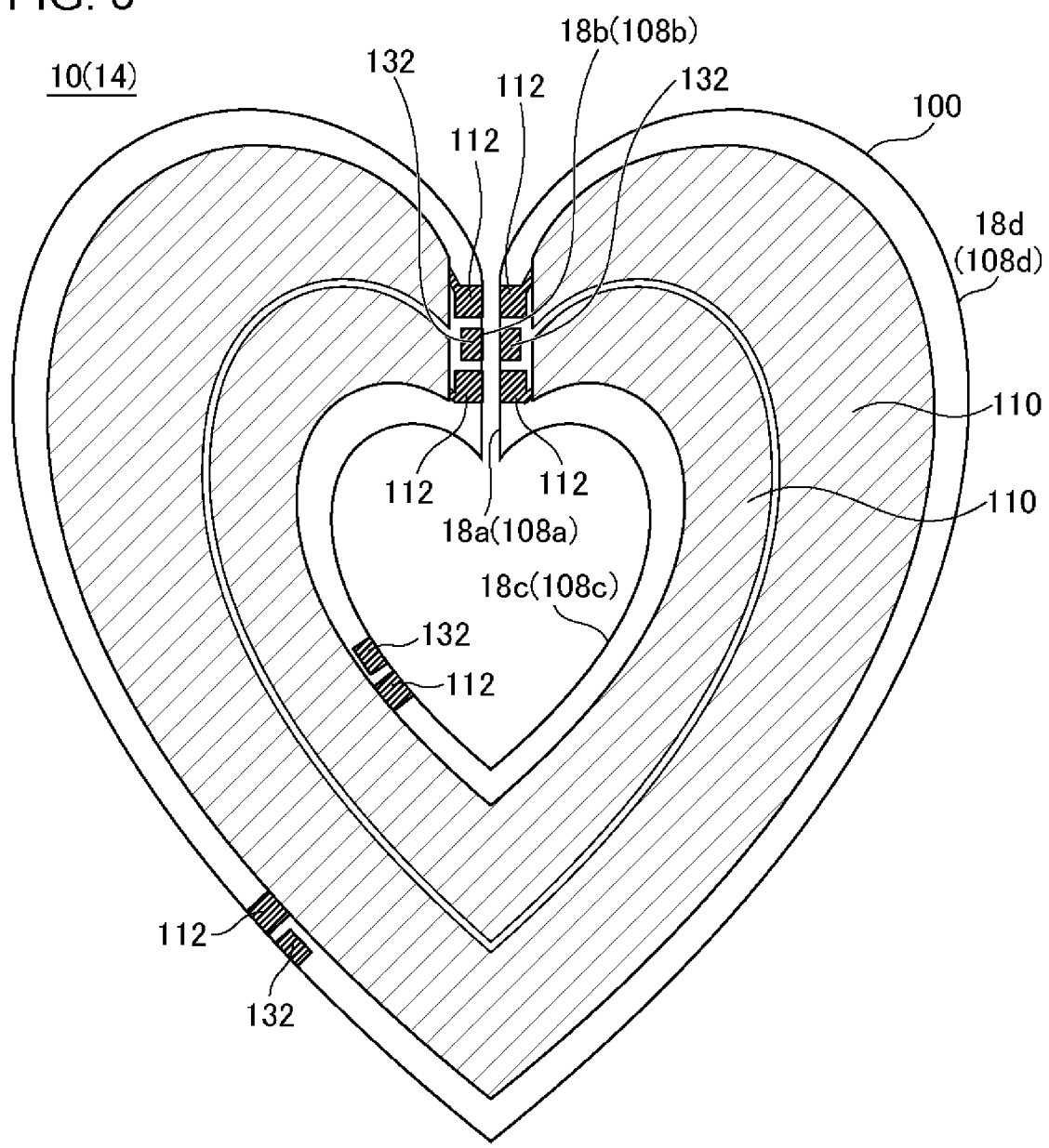
FIG. 6 is a diagram in which an insulating layer is removed from FIG. 5.
Figure 7:
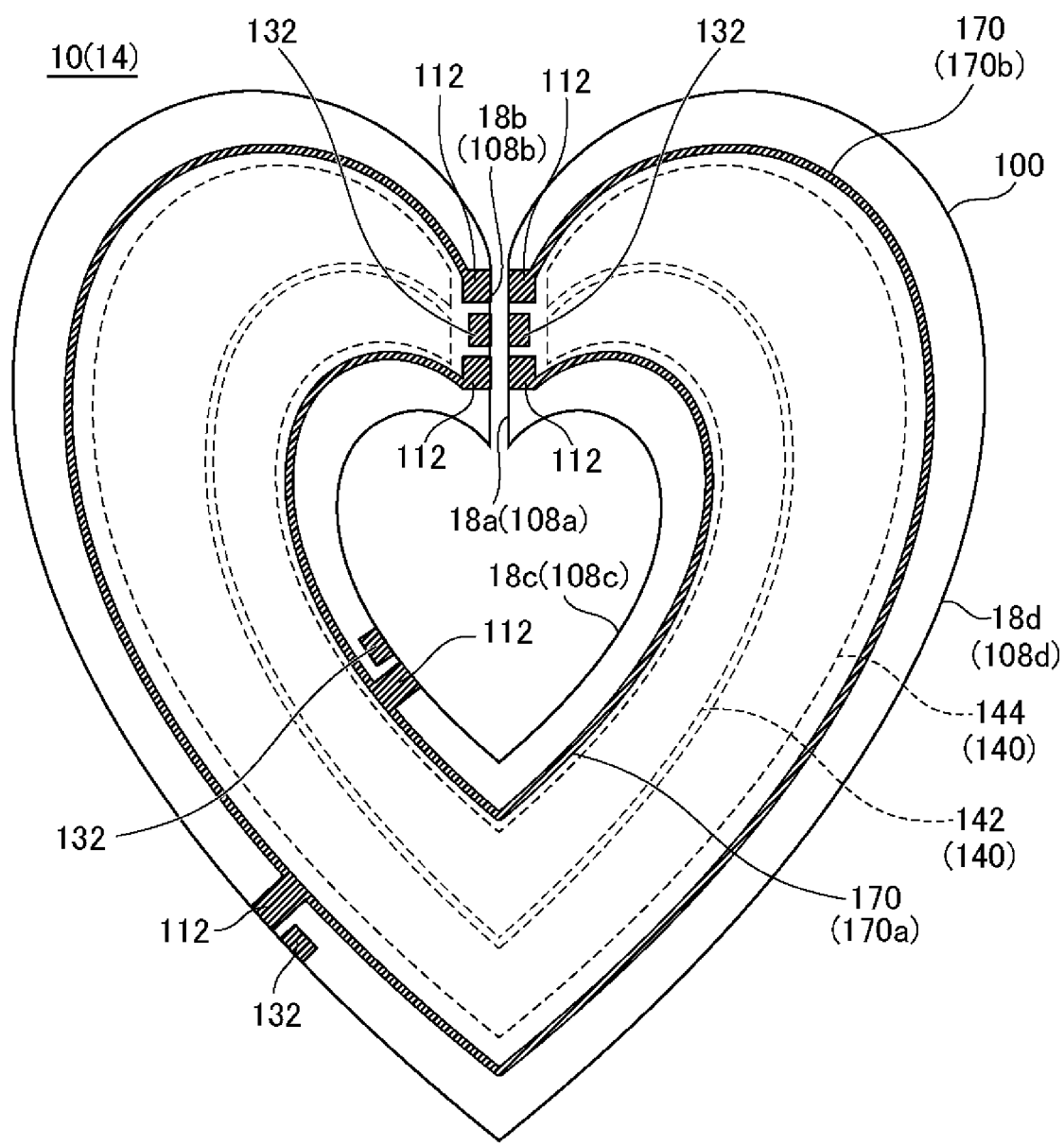
FIG. 7 is a diagram in which a first electrode is removed from FIG. 6.
Figure 8:
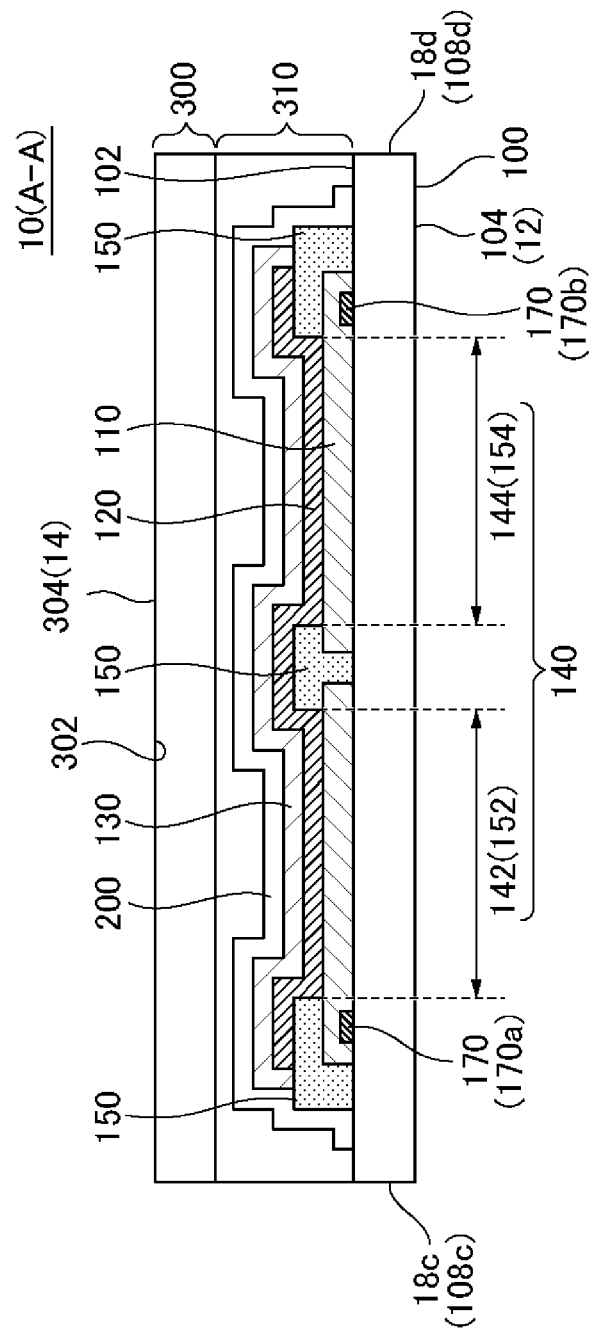
FIG. 8 is a cross-sectional view taken along line A-A of FIG. 4.

FIG. 1 is a perspective view showing a light-emitting device 20 according to an embodiment. FIG. 2 is a perspective view of the light-emitting device 20 shown in FIG. 1 viewed from a direction different from that of FIG. 1. FIG. 3 is a plan view showing a light-emitting member 10 shown in FIG. 1 and FIG. 2 viewed from a first surface 12 side of the light-emitting member 10. FIG. 4 is a plan view showing the light-emitting member 10 shown in FIG. 1 and FIG. 2 viewed from a second surface 14 side of the light-emitting member 10. FIG. 5 is a diagram in which a second electrode 130 is removed from FIG. 4. FIG. 6 is a diagram in which an insulating layer 150 is removed from FIG. 5. FIG. 7 is a diagram in which a first electrode 110 is removed from FIG. 6. FIG. 8 a cross-sectional view taken along line A-A of FIG. 4.

A summary of the light-emitting device 20 is explained using FIG. 1. A light-emitting device 20 includes a plurality of light-emitting members 10, and particularly in the example shown in FIG. 1, the light-emitting device 20 includes a first light-emitting member 10a and a second light-emitting member 10b. Each of the first light-emitting member 10a and the second light-emitting member 10b includes a first surface 12 and a second surface 14, and light is emitted from the first surface 12. The first light-emitting member 10a includes a first region 16a and a second region 16b, the first region 16a of the first light-emitting member 10a being located on the second surface 14 side of the second light-emitting member 10b and the second region 16b of the first light-emitting member 10a being located on the first surface 12 side of the second light-emitting member 10b.

According to the above-mentioned configuration, the light-emitting device 20 can provide a stereoscopic feeling. Specifically, in the above-mentioned configuration, the first region 16a of the first light-emitting member 10a is located on the second surface 14 side of the second light-emitting member 10b, and the second region 16b of the first light-emitting member 10a is located on the first surface 12 side of the second light-emitting member 10b. That is, the first region 16a and the second region 16b of the first light-emitting member 10a are at locations which are different from each other in the depth direction of the second light-emitting member 10b. Therefore, the light-emitting device 20 provides a stereoscopic feeling. In addition, the light-emitting device 20 having a high degree of freedom in design by the plurality of light-emitting members 10 can be provided.

Particularly in the example shown in FIG. 1, the first light-emitting member 10a intersects the second light-emitting member 10b from the first region 16a to the second region 16b. Thus, the stretch achieved by the first light-emitting member 10a in the depth direction from the first region 16a to the second region 16b can be made conspicuous. Therefore, the stereoscopic feeling of the light-emitting device 20 can be made conspicuous.

The light-emitting device 20 can be applied to various uses. In one example, the light-emitting device 20 may be used as an automobile tail lamp. In another example, the light-emitting device 20 may also be used as a lighting device or a display device.

Next, details of the light-emitting device 20 will be described using FIG. 1.

The first light-emitting member 10a and the second light-emitting member 10b are connected to each other. Specifically, each light-emitting member 10 extends to define an opening 18. Each light-emitting member 10 includes two ends facing each other with a gap therebetween, that is, a first end 18a and a second end 18b, and extends from the first end 18a to the second end 18b. The opening 18 is communicated with a space outside the light-emitting member 10 through the gap between the first end 18a and the second end 18b. Therefore, the second light-emitting member 10b can be passed through from the gap between the first end 18a and the second end 18b in the first light-emitting member 10a to the opening 18 of the first light-emitting member 10a, and at the same time, the first light-emitting member 10a can be passed through from the gap between the first end 18a to the second end 18b in the second light-emitting member 10b to the opening 18 of the second light-emitting member 10b.

Each light-emitting member 10 is heart-shaped. Particularly in the example shown in FIG. 1, the light-emitting member 10 includes an inner edge 18c and an outer edge 18d. The inner edge 18c extends along the heart shape to define the opening 18, and the outer edge 18d defines a light-emitting unit 140 as the heart shape along the inner edge 18c.

The light-emitting member 10 includes the light-emitting unit 140, and the light-emitting unit 140 is heart-shaped as is the case with the light-emitting member 10. Particularly in the example shown in FIG. 1, the light-emitting unit 140 extends from the first end 18a to the second end 18b, and the outer edge of the light-emitting unit 140 is along the first end 18a, the second end 18b, the inner edge 18c, and the outer edge 18d.

In the example shown in FIG. 1, two light-emitting members 10 are connected to each other. However, in another example, three or more light-emitting members 10 may be connected.

Next, details of the light-emitting device 20 will be described using FIG. 2.

The first light-emitting member 10a continues from the first region 16a to the second region 16b via the opening 18 of the second light-emitting member 10b. Thus, the stretch achieved by the first light-emitting member 10a in the depth direction from the first region 16a to the second region 16b can be made conspicuous. Therefore, a stereoscopic feeling of the light-emitting device 20 can be made conspicuous.

The second surface 14 of the second light-emitting member 10b includes a third region 16c, and the third region 16c faces the first surface 12 in the first region 16a of the first light-emitting member 10a. Therefore, a light-emitting surface (that is, a first surface 12) in the first region 16a of the first light-emitting member 10a is hidden behind a light-emitting surface (that is, a first surface 12) of the second light-emitting member 10b. Thus, a stereoscopic feeling of the light-emitting device 20 can be made conspicuous.

The first surface 12 of the second light-emitting member 10b includes a fourth region 16d, and the fourth region 16d faces the second surface 14 in the second region 16b of the first light-emitting member 10a. Therefore, a light-emitting surface (that is, a first surface 12) in the fourth region 16d of the second light-emitting member 10b is hidden behind the light-emitting surface (that is, the first surface 12) of the first light-emitting member 10a. Thus, a stereoscopic feeling of the light-emitting device 20 can be made conspicuous.

Particularly in the example shown in FIG. 2, each light-emitting member 10 is partially curved or bent (that is, each light-emitting member 10 includes a curved portion or a bent portion). Therefore, each light-emitting member 10 provides a stereoscopic feeling.

In addition, in the example shown in FIG. 2, the first region 16a of the first light-emitting member 10a and the third region 16c of the second light-emitting member 10b are located separately from each other with a gap therebetween, and the second region 16b of the first light-emitting member 10a and the fourth region 16d of the second light-emitting member 10b are located separately from each other with a gap therebetween. Thereby, friction between the first light-emitting member 10a and the second light-emitting member 10b may be inhibited, and damage to the light-emitting member 10 caused by friction may be inhibited. In another example, the first light-emitting member 10a and the second light-emitting member 10b may be in contact with each other. By positively fixing the location of the first light-emitting member 10a and the location of the second light-emitting member 10b by bringing the first light-emitting member 10a and the second light-emitting member 10b in contact with each other, one light-emitting member 10 can be prevented from moving with respect to another light-emitting member 10.

Then, details of the light-emitting unit 140 will be described using FIG. 3.

The light-emitting unit 140 is separated into a plurality of sections, and particularly in the example shown in FIG. 3, the light-emitting unit 140 is separated into a first section 142 and a second section 144. The first section 142 and the second section 144 are electronically insulated from each other. Therefore, switching on/off light emission in the first section 142 and switching on/off light emission in the second section 144 may be controlled independently of each other. Lighting may be controlled assuming that the first section 142 and the second section 144 have the same emission color or colors different from each other.

In the example shown in FIG. 3, the light-emitting unit 140 is separated into a plurality of sections (first section 142 and second section 144) along a direction from one out of the inner edge 18c and the outer edge 18d toward the other. In another example, the light-emitting unit 140 may be separated into the plurality of sections along the length direction of the light-emitting member 10 from one out of the first end 18a and the second end 18b toward the other. Further in another example, the light-emitting unit 140 need not be separated into the plurality of sections.

Next, a plan layout of the light-emitting member 10 will be described using FIGS. 4-7.

The light-emitting member 10 includes a substrate 100, two first electrodes 110, an organic layer 120, a second electrode 130, an insulating layer 150, two conductive portions 170 (conductive portion 170a and conductive portion 170b), and a sealing layer 200.

Details of the substrate 100 and the two conductive portions 170 will be described using FIG. 7.

The substrate 100 defines the shape of the light-emitting member 10. Specifically, the substrate 100 includes a first end 108a, a second end 108b, an inner edge 108c, and an outer edge 108d. The first end 108a, the second end 108b, the inner edge 108c, and the outer edge 108d of the substrate 100 are the first end 18a, the second end 18b, the inner edge 18c, and the outer edge 18d of the light-emitting member 10, respectively.

The conductive portion 170a extends along the inner edge 108c of the substrate 100, and the conductive portion 170b extends along the outer edge 108d of the substrate 100. The conductive portion 170 contains a low-resistance material, and is supplied with electrical potential from a plurality of locations (that is, first terminals 112). Therefore, a voltage drop in the extending direction of the conductive portion 170 can be inhibited. Particularly in the example shown in FIG. 7, the conductive portion 170a can be supplied with electrical potential from the first terminals 112 disposed along the first end 108a of the substrate 100, the first terminals 112 disposed along the inner edge 108c of the substrate 100, and the first terminals 112 disposed along the second end 108b of the substrate 100, and the conductive portion 170b can be supplied with electrical potential from the first terminals 112 disposed along the first end 108a of the substrate 100, the first terminals 112 disposed along the outer edge 108d of the substrate 100, and the first terminals 112 disposed along the second end 108b of the substrate 100.

According to the above-mentioned layout of the conductive portion 170, the aesthetic appearance of the light-emitting member 10 can be prevented from becoming impaired by the conductive portion 170. Specifically, the conductive portion 170 contains a light-shielding material and does not have light-transmitting properties. If the conductive portion 170 overlaps the light-emitting unit 140, and light is emitted from the light-emitting member 10, a region out of the light-emitting unit 140 overlapped with the conductive portion 170 becomes a non-light-emitting portion since light is shielded by the conductive portion 170, the aesthetic appearance of the light-emitting member 10 may be impaired. In the example shown in FIG. 7, no conductive portion overlapping the light-emitting unit 140 is provided, and particularly, the conductive portion 170a and the conductive portion 170b extend along the outer edge of the light-emitting unit 140. Therefore, the aesthetic appearance of the light-emitting member 10 can be prevented from becoming impaired by the conductive portion 170.

Details of the two first electrodes 110 will be described using FIG. 6.

The two first electrodes 110 are aligned along a direction from one out of the inner edge 108c and the outer edge 108d of the substrate 100 toward the other. The first electrode 110 on the inner edge 108c side is electronically connected to the conductive portion 170a (FIG. 7), and the first electrode 110 on the outer edge 108d side is electronically connected to the conductive portion 170b (FIG. 7).

According to an above-mentioned layout of the first electrodes 110, the first section 142 and the second section 144 of the light-emitting unit 140 (for example, FIG. 5) can be electronically insulated from each other. Specifically, the two first electrodes 110 are electronically insulated from each other. The first electrode 110 on the inner edge 108c side configures the first section 142 of the light-emitting unit 140 (for example, FIG. 5), and the first electrode 110 on the outer edge 108d side configures the second section 144 of the light-emitting unit 140 (for example, FIG. 5). Therefore, the first section 142 and the second section 144 can be electronically insulated from each other.

According to the above-mentioned layout of the first electrodes 110, variation in luminance of the light-emitting unit 140 may be inhibited. Specifically, the first electrodes 110 include a material having a relatively high resistance, that is, a material in which a voltage drop easily occurs, since a material having light-transmitting properties is selected. In the example shown in FIG. 6, by aligning the two first electrodes 110 in the direction from one out of the inner edge 108c and the outer edge 108d toward the other, the length of each first electrode 110 in the direction from one out of the inner edge 108c and the outer edge 108d toward the other can be shortened. Therefore, a voltage drop of the first electrodes 110 in the direction from one out of the inner edge 108c and the outer edge 108d toward the other can be inhibited, and thereby variation in luminance of the light-emitting unit 140 can be inhibited.

Details of the insulating layer 150 and the organic layer 120 will be described using FIG. 5.

The insulating layer 150 includes a plurality of openings, that is, a first opening 152 and a second opening 154. The first opening 152 exposes the first electrode 110 on the inner edge 108c side of the substrate 100, and the second opening 154 exposes the first electrode 110 on the outer edge 108d side of the substrate 100. Thus, the first opening 152 defines the first section 142 of the light-emitting unit 140, and the second opening 154 defines the second section 144 of the light-emitting unit 140.

The organic layer 120 spreads in the direction from one out of the inner edge 108c and the outer edge 108d of the substrate 100 toward the other, and specifically, covers both of the first electrode 110 on the inner edge 108c side of the substrate 100 and the first electrode 110 on the outer edge 108d side of the substrate 100.

Details of the second electrode 130 and the sealing layer 200 will be described using FIG. 4.

The second electrode 130 spreads from one out of the inner edge 108c and the outer edge 108d of the substrate 100 toward the other, and specifically, covers both of the first electrode 110 on the inner edge 108c side of the substrate 100 (FIG. 5 and FIG. 6) and the first electrode 110 on the outer edge 108d side of the substrate 100 (FIG. 5 and FIG. 6).

The second electrode 130 is supplied with an electrical potential from a plurality of locations (that is, second terminals 132). Therefore, variation in electrical potential of the second electrode 130 can be inhibited. Particularly in the example shown in FIG. 4, the second electrode 130 can be supplied with an electrical potential from the second terminal 132 disposed along the first end 108a of the substrate 100, the second terminal 132 disposed along the inner edge 108c of the substrate 100, the second terminal 132 disposed along the second end 108b of the substrate 100, and the second terminal 132 disposed along the outer edge 108d of the substrate 100.

The sealing layer 200 spreads to the outside of the second electrode 130, and the outer edge of the sealing layer 200 extends along the first end 108a, the inner edge 108c, the second end 108b, and the outer edge 108d of the substrate 100.

Then, details of a cross-section of the light-emitting member 10 will be described using FIG. 8.

The light-emitting member 10 includes the substrate 100, the first electrode 110, the organic layer 120, the second electrode 130, the insulating layer 150, the conductive portion 170, the sealing layer 200, a supporting substrate 300, and an adhesive layer 310.

The substrate 100 (first substrate) includes a first surface 102 and a second surface 104. The first electrode 110, the organic layer 120, and the second electrode 130 overlap in order from the first surface 102 of the substrate 100 to configure the light-emitting unit 140. The second surface 104 is on the opposite side of the first surface 102, and is the first surface 12 of the light-emitting member 10. That is, the light-emitting member 10 is a bottom-emission type OLED panel, and light generated from the light-emitting unit 140 on the first surface 102 side of the substrate 100 is transmitted through the substrate 100, and emitted from the first surface 102 (first surface 12 of light-emitting member 10) of the substrate 100. That is, light is emitted from the first surface 102 of the light-emitting member 10.

In another example, the light-emitting member 10 may be a top-emission type OLED panel. In this example, light generated from the light-emitting unit 140 is emitted from the second surface 14 of the light-emitting member 10. In the present embodiment, the light-emitting member 10 will be described as a bottom-emission type OLED panel below.

The substrate 100 has flexibility. Therefore, as shown in FIG. 2, the light-emitting member 10 (that is, the substrate 100) can be partially curved or bent.

The substrate 100 includes an insulating material having light-transmitting properties. In one example, the substrate 100 is a glass substrate. In another example, the substrate 100 may be a resin substrate and may include polyethylene naphthalate (PEN), polyether sulphone (PES), polyethylene terephthalate (PET), or polyimide. An inorganic barrier layer (for example, a $SiN_x$ layer, a SiON layer, a $SiO_2$ layer, an $Al_2O_3$ layer, or a HfO layer) may be formed on at least one of the first surface 102 and the second surface 104 of the substrate 100.

The first electrode 110 includes a material having light-transmitting properties and conductivity, and in one example, the first electrode 110 includes a metal oxide, and more specifically, an indium tin oxide (ITO), an indium zinc oxide (IZO), an indium tungsten zinc oxide (IWZO), or a zinc oxide (ZnO). In another example, the first electrode 110 may include a conductive organic material, and more specifically, carbon nanotubes or PEDOT/PSS.

The organic layer 120 can emit light by organic electroluminescence (EL). In one example, the organic layer 120 includes, for example, a hole injection layer (HIL), a hole transport layer (HTL), a light-emitting layer (EML), an electron transport layer (ETL), and an electron injection layer (EIL). A hole is injected from the first electrode 110 to the EML through the HIL and the HTL, an electron is injected from the second electrode 130 to the EML through the EIL and the ETL, and the hole and the electron are recombined in the EML to emit light.

The second electrode 130 includes a material having light reflectivity and conductivity, which is in one example, a metal, and more specifically, a metal selected from the group consisting of Al, Au, Ag, Pt, Mg, Sn, Zn, and In, or an alloy of metals selected from this group.

The insulating layer 150 defines the light-emitting unit 140. Specifically, each of the first section 142 and the second section 144 of the light-emitting unit 140 includes a laminate of the first electrode 110, the organic layer 120, and the second electrode 130. Particularly in the example shown in FIG. 8, the first electrode 110, the organic layer 120, and the second electrode 130 are laminated in this order in the first opening 152 of the insulating layer 150 to configure the first section 142, and the first electrode 110, the organic layer 120, and the second electrode 130 are laminated in this order in the second opening 154 of the insulating layer 150 to configure the second section 144.

The insulating layer 150 includes an organic material, more specifically, a cured product of a photosensitive resin (for example, a polyimide). That is, the insulating layer 150 may be formed by curing a photosensitive resin by light (for example, ultraviolet rays). In another example, the insulating layer 150 may include an inorganic material, such as $SiO_2$ or SiON.

The conductive portion 170 is located on the first surface 102 side of the substrate 100, and is covered with the first electrode 110. The conductive portion 170 includes a material having a resistance which is lower than that of the material included in the first electrode 110. Therefore, the conductive portion 170 can function as an auxiliary electrode of the first electrode 110. In another example, the conductive portion 170 need not be covered with the first electrode 110, and may be located over the first electrode 110 and covered with the insulating layer 150.

The conductive portion 170 includes a low-resistance material, which is in one example, a metal, and more specifically, a metal selected from the group consisting of Al, Ag, and Mo, or an alloy of metals selected from the group. In one detailed example, the conductive portion 170 includes APC (AgPdCu). In another detailed example, the conductive portion 170 may be MAM (Mo/Al/Mo), Ni/Al/Ni, or Cr/Al/Cr.

The sealing layer 200 seals the first surface 102 of the substrate 100 and the light-emitting unit 140. Particularly in the example shown in FIG. 8, the sealing layer 200 is in contact with the first surface 102 of the substrate 100 at the outside of the insulating layer 150. Therefore, a substance (for example, water or air) which deteriorates the organic layer 120 and the second electrode 130 can be inhibited from entering from a side of the insulating layer 150.

The sealing layer 200 includes, in one example, an inorganic barrier layer, more specifically, at least one of $SiN_x$, SiON, $Al_2O_3$, $TiO_2$, $SiO_2$, and SiOC. The inorganic barrier layer can be formed by, in one example, Atomic Layer Deposition (ALD), sputtering, or Chemical Vapor Deposition (CVD).

The supporting substrate 300 functions as a member to support the shape of the substrate 100. The substrate 100 has high flexibility. Therefore, as shown in FIG. 2, the substrate 100 can be partially curved or bent. On the other hand, the substrate 100 may be easily deformed due to the flexibility thereof. Therefore, in order to maintain the shape of the substrate 100 constant, a member having a certain hardness, that is, the supporting substrate 300 is necessary.

The supporting substrate 300 may further function as a member (sealing substrate) to seal the first surface 102 of the substrate 100 and the light-emitting unit 140.

The supporting substrate 300 (second substrate) includes a first surface 302 and a second surface 304. The supporting substrate 300 is installed on the substrate 100 through the adhesive layer 310 so that the first surface 302 faces the first surface 102 of the substrate 100 with the light-emitting unit 140 therebetween. The second surface 304 is located on the opposite side of the first surface 302, and is the second surface 14 of the light-emitting member 10.

In one example, the supporting substrate 300 may include a material having light reflectivity (for example, Al). In this example, as it is clear from FIG. 2, the first surface 12 in the first region 16a of the first light-emitting member 10a faces the supporting substrate 300 of the second light-emitting member 10b, and the first surface 12 in the fourth region 16d of the second light-emitting member 10b faces the supporting substrate 300 of the first light-emitting member 10a. Therefore, light emitted from the first surface 12 in the first region 16a of the first light-emitting member 10a may be reflected by the supporting substrate 300 of the second light-emitting member 10b, and light emitted from the first surface 12 in the fourth region 16d of the second light-emitting member 10b may be reflected by the supporting substrate 300 of the first light-emitting member 10a. Therefore, light can also be extracted from portions other than the first surface 12, and the light-emitting device 20 having light diffusibility may be provided.

Figure 9:
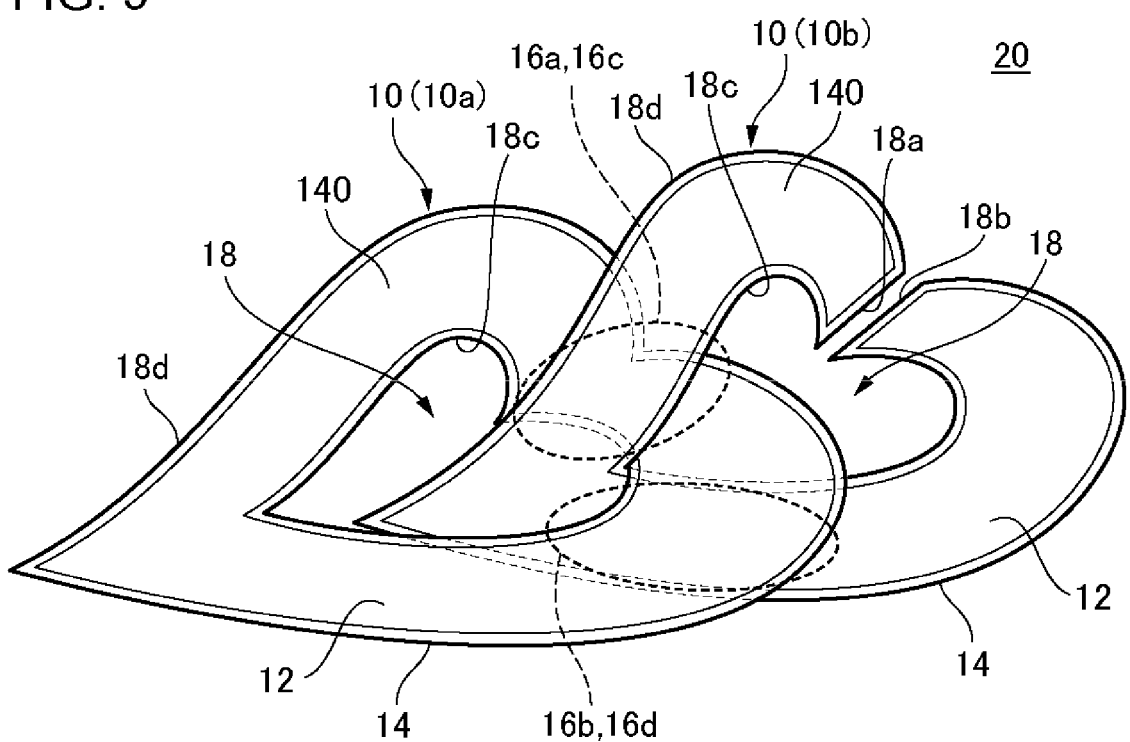
FIG. 9 is a diagram showing a modification example of FIG. 1.

FIG. 9 is a diagram showing a modification example of FIG. 1. As shown in FIG. 9, one out of the two light-emitting members 10, particularly in the example shown in FIG. 9, the first light-emitting member 10a, need not include a gap to connect the opening 18 to the outside of the first light-emitting member 10a. In the example shown in FIG. 9, the first light-emitting member 10a can be passed through a gap between the first end 18a and the second end 18b of the second light-emitting member 10b to the opening 18 of the second light-emitting member 10b.

Figure 10:
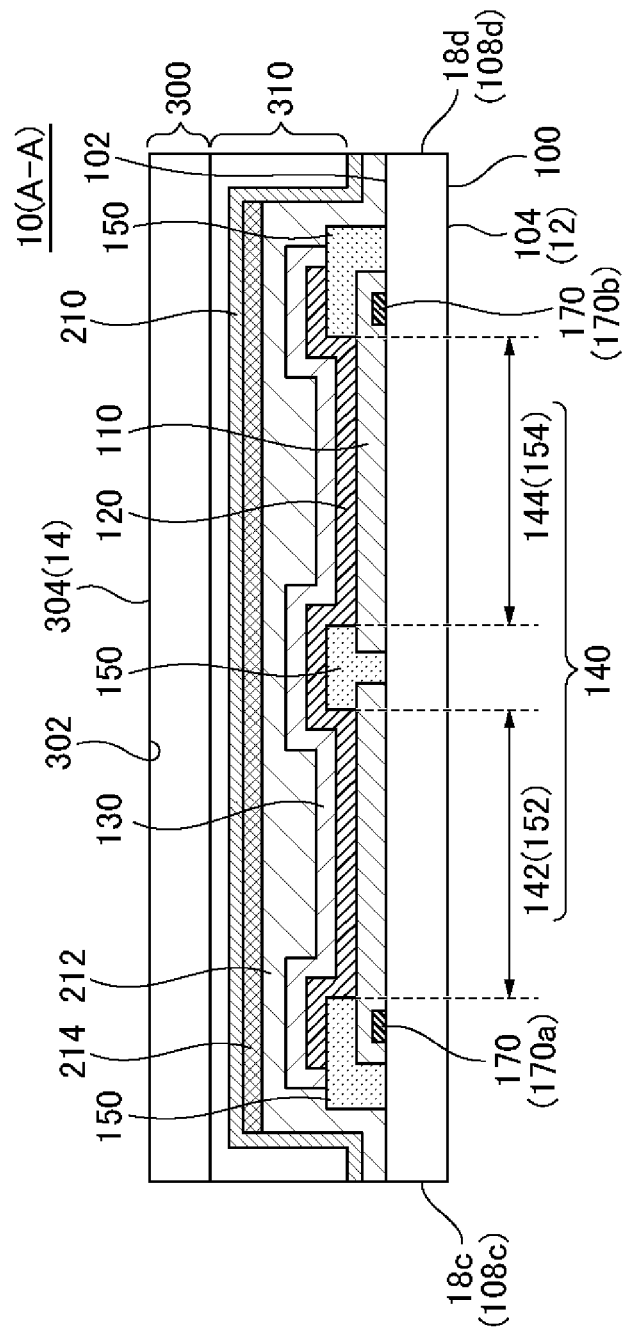
FIG. 10 is a diagram showing a modification example of FIG. 8.

FIG. 10 is a diagram showing a modification example of FIG. 8. In the example shown in FIG. 10, the light-emitting member 10 includes a sealing portion 210, an adhesive layer 212, and a desiccant 214 instead of the sealing layer 200 (FIG. 8). The sealing portion 210 is a metal substrate, a resin substrate, or a glass substrate, and an end of the sealing portion 210 is bent. The sealing portion 210 is installed on the first surface 102 of the substrate 100 through the adhesive layer 212, and covers the light-emitting unit 140. The desiccant 214 is located between the sealing portion 210 and the adhesive layer 212.

Figure 11:
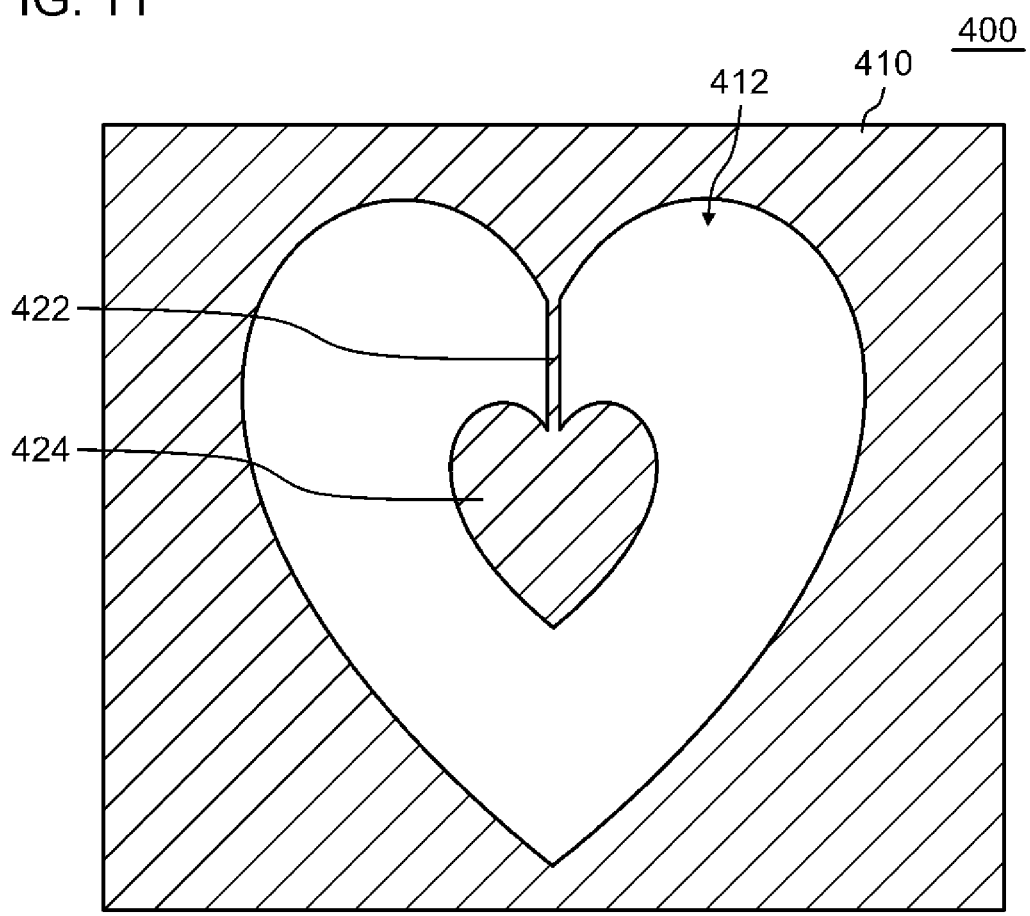
FIG. 11 is a diagram showing a mask used in manufacturing a light-emitting member shown in FIGS. 1-8.

FIG. 11 is a diagram showing a mask 400 used in manufacturing the light-emitting member 10 shown in FIGS. 1-8. In one example, the light-emitting member 10 shown in FIGS. 1-8 may be manufactured as below.

First, the substrate 100 is prepared. The substrate 100 may be worked into the shape shown in FIGS. 1-8 before the light-emitting unit 140 is formed, or may be worked into the shape shown in FIGS. 1-8 after the light-emitting unit 140 is formed.

Next, the first terminal 112, the second terminal 132, and the conductive portion 170 are formed on the first surface 102 side of the substrate 100. In one example, the first terminal 112, the second terminal 132, and the conductive portion 170 may be formed by patterning the conductive layer deposited by sputtering.

Then, the first electrode 110 is formed on the first surface 102 side of the substrate 100. In one example, the first electrode 110 may be formed by patterning a transparent conductive layer.

Then, the insulating layer 150 is formed covering a portion of the substrate 100 on the first surface 102 side and the first electrode 110. In one example, the insulating layer 150 may be formed by patterning the photosensitive resin.

Then, the organic layer 120 is formed to cover the first electrode 110 and the insulating layer 150. In one example, the organic layer 120 may be formed by a coating process. In another example, the organic layer 120 may also be formed by vapor deposition using a mask (details will be described later using FIG. 11).

Then, the second electrode 130 is formed to cover the organic layer 120. In one example, the second electrode 130 may be formed by vapor deposition using a mask (details will be described later using FIG. 11).

Then, the sealing layer 200 is formed to cover the second electrode 130. In one example, the sealing layer 200 may be formed by ALD.

Then, the supporting substrate 300 and the substrate 100 are bonded together through the adhesive layer 310.

Thus, the light-emitting member 10 shown in FIGS. 1-8 is manufactured.

The mask 400 shown in FIG. 11 may be used for the vapor deposition of the organic layer 120 and the second electrode 130. The mask 400 includes a cover 410, and the cover 410 includes an opening 412. The mask 400 includes a cover 424 in the opening 412, and the cover 424 is supported on the cover 410 by a beam 422.

The organic layer 120 and the second electrode 130 may be deposited using the mask 400. Specifically, the organic layer 120 and the second electrode 130 are deposited on the substrate 100 through the opening 412 of the mask 400. In addition, vapor deposition of the organic layer 120 and the second electrode 130 to the opening 18 and the surroundings of the opening 18 can be prevented by the cover 424 in the opening 412.

In a case where the mask 400 shown in FIG. 11 is used, the gap between the first end 18a and the second end 18b of the light-emitting member 10 functions not only as a gap for passing one light-emitting member 10 through the opening 18 of another light-emitting member 10 (for example, see FIG. 1 or FIG. 2), but also as a region to provide the beam 422 of the mask 400 therein. Specifically, it is necessary to support the cover 424 on the cover 410 by the beam 422 in order to dispose the cover 424 in the opening 412. In the meanwhile, the organic layer 120 and the second electrode 130 cannot be deposited in a region overlapping the beam 422. However, in the light-emitting member 10 shown in FIGS. 1-8, the organic layer 120 and the second electrode 130 need not be deposited in the gap between the first end 18a and the second end 18b and the vicinity thereof, and therefore, the beam 422 can be provided.

As described above, according to the present embodiment, the light-emitting device 20 can provide a stereoscopic feeling.

Modification Example 1

Figure 12:
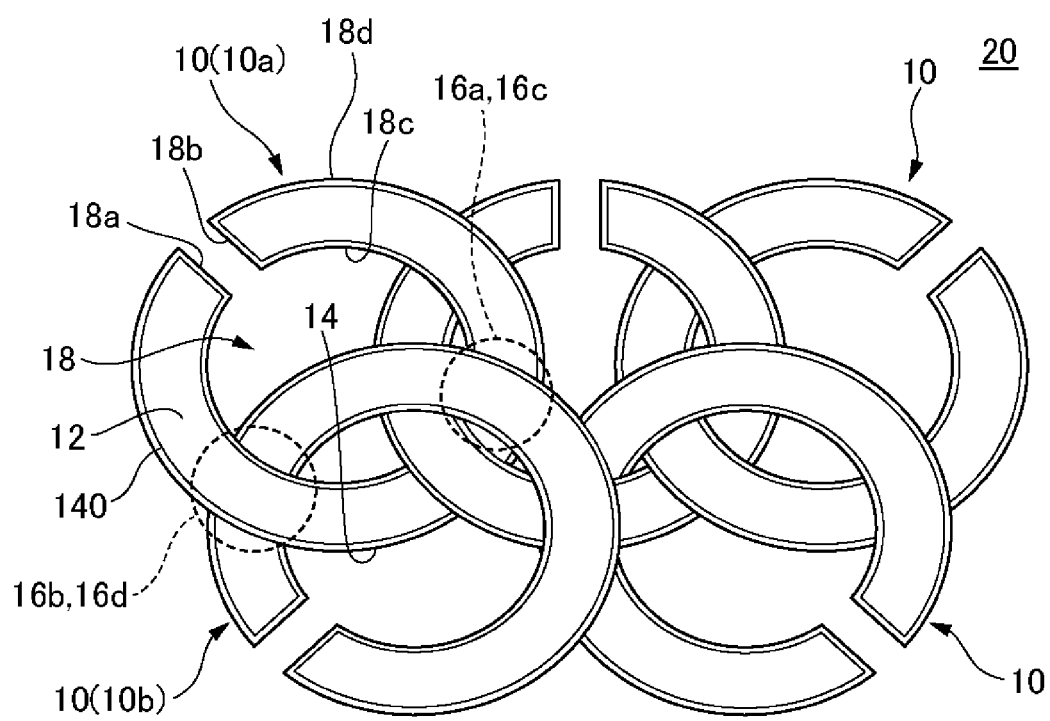
FIG. 12 is a diagram showing a light-emitting device according to Modification Example 1.

FIG. 12 is a diagram showing a light-emitting device 20 according to Modification Example 1. The light-emitting device 20 according to the present modification example is the same as the light-emitting device 20 according to the embodiment except the following.

The light-emitting device 20 includes five light-emitting members 10, and the five light-emitting members 10 are aligned to form the Olympic emblem (five rings).

As is the case with the light-emitting member 10 according to the embodiment, each light-emitting member 10 includes an opening 18, a first end 18a, a second end 18b, an inner edge 18c, an outer edge 18d, and a light-emitting unit 140. Each light-emitting member 10 extends from the first end 18a to the second end 18b to define the opening 18. The outer edge of the light-emitting unit 140 is along the first end 18a, the second end 18b, the inner edge 18c, and the outer edge 18d.

The plurality of light-emitting members 10 include a first light-emitting member 10a and a second light-emitting member 10b, and as is the case with the embodiment, the first light-emitting member 10a includes a first region 16a and a second region 16b, the first region 16a of the first light-emitting member 10a being located on the second surface 14 side of the second light-emitting member 10b, and the second region 16b of the first light-emitting member 10a being located on the first surface 12 side of the second light-emitting member 10b. Therefore, the light-emitting device 20 provides a stereoscopic feeling.

Modification Example 2

A light-emitting device 20 according to Modification Example 2 will be described using FIG. 1 and FIG. 2.

In Modification Example 2, portions which cannot be seen from the first surface 12 side of each light-emitting member 10, that is, a first region 16a of a first light-emitting member 10a (a portion hidden behind a second light-emitting member 10b when viewed from the first surface 12 side of the second light-emitting member 10b), and a fourth region 16d of the second light-emitting member 10b (a portion hidden behind the first light-emitting member 10a when viewed from the first surface 12 side of the first light-emitting member 10a) need not emit light. Since the portions cannot be seen from the first surface 12 side of each light-emitting member 10, the aesthetic appearance of the light-emitting device 20 is hardly effected even if the portions do not emit light. In addition, by preventing the portions from emitting light, the area of light-emission of each light-emitting member 10 may be smaller, allowing the electrical power consumption by the light-emitting device 20 to be suppressed. In addition, generation of heat in a portion where light is overlapped can be inhibited.

As described above, although the embodiment and examples of the present invention have been set forthwith reference to the accompanying drawings, they are merely illustrative of the present invention, and various configurations other than those stated above can be adopted.

This application claims priority from Japanese Patent Application No. 2017-096332, filed May 15, 2017, the disclosure of which is incorporated by reference in its entirety.

The invention claimed is:

1. A light-emitting device comprising:
    a first light-emitting member and a second light-emitting member, each of the first light-emitting member and the second light-emitting member comprising a first surface emitting light, a second surface on an opposite side of the first surface, a first electrode, an organic layer, and a second electrode,
    wherein the first light-emitting member comprises a first region located on the second surface side of the second light-emitting member, and a second region located on the first surface side on the second light-emitting member.

2. The light-emitting device according to claim 1, wherein each of the first light-emitting member and the second light-emitting member comprises a first substrate having the first surface and a second substrate having the second surface.

3. The light-emitting device according to claim 2, wherein each of the second substrate of the first light-emitting member and the second substrate of the second light-emitting member comprises a material having light reflectivity.

4. The light-emitting device according to claim 1, wherein the second surface of the second light-emitting member comprises a third region facing the first surface in the first region of the first light-emitting member.

5. The light-emitting device according to claim 1, wherein the first surface of the second light-emitting member comprises a fourth region facing the second surface in the second region of the first light-emitting member.

6. The light-emitting device according to claim 1, wherein the first light-emitting member continues from the first region to the second region.

7. The light-emitting device according to claim 1, wherein an opening is formed in the second light-emitting member, and
    wherein the first light-emitting member intersects the second light-emitting member from the first region to the second region via the opening.

8. The light-emitting device according to claim 1, wherein the first light-emitting member comprises a first end and a second end, the first light-emitting member extending from the first end to the second end, and
    wherein the first end and the second end of the first light-emitting member face each other with a gap therebetween.

9. The light-emitting device according to claim 1, wherein the first region does not emit light.

10. The light-emitting device according to claim 1, wherein a portion of the second light-emitting member overlapping the second region does not emit light.

* * * * *